(12) United States Patent
Choi et al.

(10) Patent No.: US 10,580,837 B2
(45) Date of Patent: Mar. 3, 2020

(54) DISPLAY APPARATUS

(71) Applicant: Samsung Display Co., Ltd., Yongin-si (KR)

(72) Inventors: Sangkyu Choi, Hwaseong-si (KR); Sungkyun Park, Suwon-si (KR); Jungha Son, Seoul (KR); Jae-Wook Kang, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/118,448

(22) Filed: Aug. 31, 2018

(65) Prior Publication Data

US 2018/0374907 A1   Dec. 27, 2018

Related U.S. Application Data (63) Continuation of application No. 15/489,662, filed on Apr. 17, 2017, now Pat. No. 10,068,951.

(30) Foreign Application Priority Data

Jun. 1, 2016   (KR) ......................... 10-2016-0068370

(51) Int. Cl.
*H01L 29/08*     (2006.01)
*H01L 27/32*     (2006.01)
(Continued)

(52) U.S. Cl.
CPC ............ *H01L 27/323* (2013.01); *G06F 3/044* (2013.01); *G06F 3/0412* (2013.01);
(Continued)

(58) Field of Classification Search
CPC ... H01L 27/32; H01L 27/3258; H01L 27/323; H01L 51/0023; H01L 51/5237
See application file for complete search history.

(56) References Cited

U.S. PATENT DOCUMENTS 9,095,017 B2   7/2015   Yi et al.
9,501,165 B2  11/2016   Kim et al.
(Continued)

FOREIGN PATENT DOCUMENTS

| KR | 10-2014-0025251 | 3/2014 |
|---|---|---|
| KR | 10-2014-0099164 | 8/2014 |
| KR | 10-2015-0075688 | 7/2015 |

OTHER PUBLICATIONS

Non-Final Office Action dated Nov. 9, 2017, issued in the U.S. Appl. No. 15/489,662.
(Continued)

*Primary Examiner* — Phuc T Dang
(74) *Attorney, Agent, or Firm* — H.C. Park & Associates, PLC (57) ABSTRACT

A display apparatus including a substrate, a display portion disposed on an active area defined at the substrate, a buffer layer disposed on the active area and a pad area defined at the substrate, a touch sensing portion disposed on the buffer layer, and a pad portion disposed between the pad area and the buffer layer. The touch sensing portion includes a first pad pattern, a middle layer disposed on the first pad pattern, and a second pad pattern disposed on the middle layer. The first pad pattern is connected to the pad portion through a first contact hole defined on the pad portion in the buffer layer. The second pad pattern is connected to the first pad pattern through a second contact hole defined on the first contact hole in the middle layer.

10 Claims, 11 Drawing Sheets

(51) Int. Cl.
- *G06F 3/044* (2006.01)
- *G06F 3/041* (2006.01)
- *H01L 51/00* (2006.01)
- *H01L 51/52* (2006.01)
- *H01L 51/56* (2006.01)

(52) U.S. Cl.
CPC ...... *H01L 27/3258* (2013.01); *H01L 51/0023* (2013.01); *H01L 51/5237* (2013.01); *H01L 51/56* (2013.01); *G06F 2203/04102* (2013.01); *G06F 2203/04103* (2013.01); *G06F 2203/04111* (2013.01); *H01L 2251/5338* (2013.01)

(56) References Cited

U.S. PATENT DOCUMENTS

| | | |
|---|---|---|
| 2012/0074408 A1 | 3/2012 | Moon et al. |
| 2013/0300678 A1* | 11/2013 | Kang ...................... G06F 3/044 345/173 |
| 2014/0145979 A1* | 5/2014 | Lee ........................ G06F 3/0412 345/173 |
| 2014/0184057 A1* | 7/2014 | Kim ....................... G06F 1/1637 313/504 |
| 2014/0217373 A1 | 8/2014 | Youn et al. |
| 2014/0360855 A1* | 12/2014 | Kim ........................ G06F 3/044 200/600 |
| 2015/0054803 A1 | 2/2015 | Yashiro et al. |
| 2015/0311471 A1* | 10/2015 | Lang ..................... H01L 51/102 257/40 |
| 2016/0041667 A1* | 2/2016 | Lai ........................ G06F 3/0412 345/173 |
| 2016/0172265 A1* | 6/2016 | Hashimoto ........... H01L 23/562 257/690 |
| 2017/0179203 A1 | 6/2017 | Ma |
| 2017/0277314 A1 | 9/2017 | Chen et al. |

OTHER PUBLICATIONS

Notice of Allowance dated May 4, 2018, issued in the U.S. Appl. No. 15/489,662.

* cited by examiner

DISPLAY APPARATUS

CROSS-REFERENCE TO RELATED APPLICATIONS

This application is a Continuation of U.S. patent application Ser. No. 15/489,662, filed on Apr. 17, 2017, now U.S. Pat. No. 10,068,951, which claims priority from and the benefit of Korean Patent Application No. 10-2016-0068370, filed on Jun. 1, 2016, which are hereby incorporated by reference for all purposes as if fully set forth herein.

BACKGROUND

Field

Exemplary embodiments of the inventive concepts relate to a display apparatus and a method of fabricating the same and, more particularly, to a display apparatus including a touch sensing portion and a method of fabricating the same.

Discussion of the Background

Various kinds of display apparatuses have been developed to be used in multimedia devices such as televisions, portable phones, tablet computers, navigation systems, game consoles, and the like. The display apparatuses include display panels that display images. The display apparatuses include keyboards and/or mice as input devices. In addition, the display apparatuses include touch sensing portions that are used as input devices that sense touches of users. The touch sensing portion and the display panel may be fabricated independently of each other and may be then coupled to each other by a coupling process.

Recently, display apparatuses having various shapes and flexibilities have been developed which differ from a conventional flat display apparatus having a rigid display panel. In other words, various flexible display apparatuses (e.g., a curved display apparatus, a bendable display apparatus, a foldable display apparatus, a rollable display apparatus, and a stretchable display apparatus) have been developed.

SUMMARY

Exemplary embodiments of the inventive concepts provide a display apparatus that includes a touch sensing portion and a method of fabricating the same.

Additional aspects will be set forth in the detailed description which follows, and, in part, will be apparent from the disclosure, or may be learned by practice of the inventive concept.

In an aspect, a display apparatus includes a substrate including an active area and a pad area, a display portion disposed on the active area, a buffer layer disposed on the active area and the pad area, a touch sensing portion including a first pad pattern, a middle layer disposed on the first pad pattern, and a second pad pattern disposed on the middle layer, and a pad portion disposed between the pad area and the buffer layer. The touch sensing portion is disposed on the buffer layer and senses an external touch. The first pad pattern is connected to the pad portion through a first contact hole, and the second pad pattern is connected to the first pad pattern through a second contact hole. The first contact hole is defined on the pad portion and is defined in the buffer layer, and the second contact hole is defined on the first contact hole and is defined in the middle layer.

The first pad pattern may be in direct contact with a top surface of the pad portion, and the second pad pattern may be in direct contact with a top surface of the first pad pattern.

At least one of the buffer layer or the middle layer may be formed of an organic layer.

The display portion may include an organic light emitting device and a thin film encapsulation layer encapsulating the organic light emitting device. The buffer layer may be disposed directly on a top surface of the thin film encapsulation layer, and the first pad pattern may be disposed directly on a top surface of the buffer layer.

A refractive index of the buffer layer may have a value between a refractive index of the thin film encapsulation layer and a refractive index of the middle layer.

A modulus of the buffer layer may be smaller than a modulus of the thin film encapsulation layer.

At least a portion of the middle layer may overlap with the first contact hole in a thickness direction.

The middle layer may not overlap with the first contact hole in a thickness direction.

The display apparatus may further include a passivation layer disposed on the second pad pattern and the middle layer. The passivation layer may include an organic layer.

The display apparatus may further include a first sensing pattern disposed in the same layer as the first pad pattern and disposed on the active area. The first sensing pattern and the first pad pattern may be electrically connected to each other.

The display apparatus may further include a second sensing pattern disposed in the same layer as the second pad pattern and disposed on the active area. The second sensing pattern and the second pad pattern may be electrically connected to each other.

The first and second sensing patterns may overlap with each other in a thickness direction.

The first pad pattern may entirely cover a top surface of the pad portion exposed by the buffer layer.

In an aspect, a method of fabricating a display apparatus includes forming a display portion on an active area of a substrate, forming a pad portion on a pad area of the substrate, forming a buffer layer on the active area and the pad portion, forming a first contact hole exposing a first exposed surface of the pad portion in the buffer layer, and forming a touch sensing portion on the buffer layer. The forming of the touch sensing portion includes forming a first pad pattern in the first contact hole, forming a middle layer on the first pad pattern, forming a second contact hole exposing a second exposed surface of the first pad pattern in the middle layer, and forming a second pad pattern in the second contact hole.

The first exposed surface may be in direct contact with the first pad pattern, and the second exposed surface may be in direct contact with the second pad pattern.

The buffer layer may include an organic layer, and the forming of the first contact hole may include removing a portion of the buffer layer by a wet etching process.

The middle layer may include an organic layer, and the forming of the second contact hole may include removing a portion of the middle layer by a wet etching process.

The forming of the first pad pattern may include forming a first conductive layer on the buffer layer and the first exposed surface, and etching the first conductive layer by a first etching solution. The first conductive layer may entirely cover the first exposed surface to prevent the first exposed surface from being etched by the first etching solution.

The forming of the second pad pattern may include forming a second conductive layer on the middle layer and the second exposed surface, and etching the second conductive layer by a second etching solution. The second conductive layer may entirely cover the second exposed surface to prevent the second exposed surface from being etched by the second etching solution.

The buffer layer may be formed directly on the display portion, and the first pad pattern may be formed directly on the buffer layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
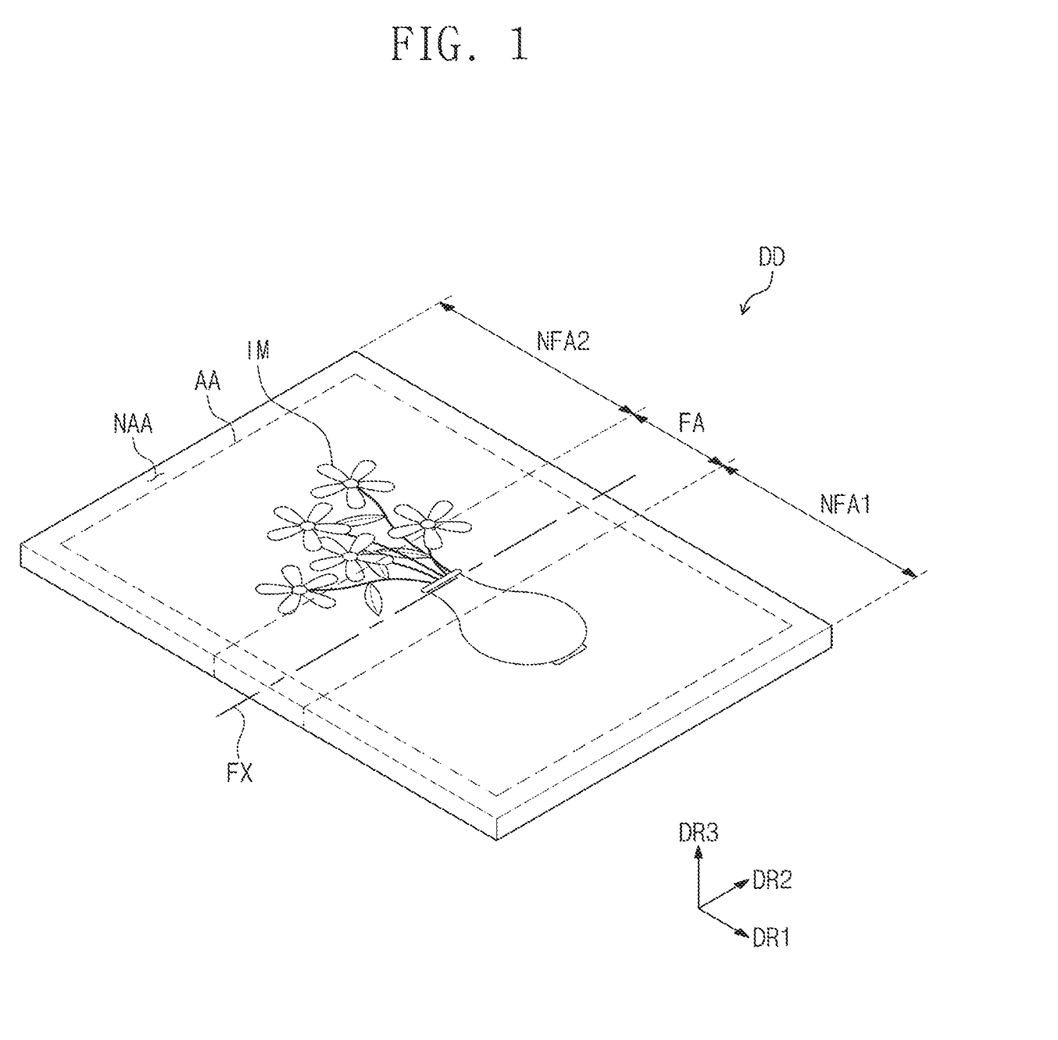
FIG. 1 is a perspective view illustrating a display apparatus according to an exemplary embodiment of the inventive concepts.

FIG. 1 is a perspective view illustrating a display apparatus according to an exemplary embodiment of the inventive concepts.

An electronic device according to the inventive concepts may include a flexible electronic module that can be stably driven even though it is bent by an external force. For example, the flexible electronic module may be a flexible display module, a flexible touch module, or a flexible solar cell module. The electronic device essentially includes an interconnection line for supplying power and/or an electrical signal to internal components. Hereinafter, a case in which the electronic device is a flexible display apparatus DD will be described as an example. However, exemplary embodiments of the inventive concepts are not limited thereto. Technical features of the inventive concepts may be applied to various flexible electronic devices.

In the present exemplary embodiment, a foldable display apparatus is illustrated as an example of the flexible display apparatus DD (hereinafter, referred to as 'a display apparatus'). However, exemplary embodiments of the inventive concepts are not limited thereto. The display apparatus DD according to an exemplary embodiment of the inventive concepts may be applied to various display apparatuses, such as a curved display apparatus, a bendable display apparatus, a rollable display apparatus, and stretchable display apparatus. Even though not shown in the drawings, the display apparatus DD according to the inventive concepts may be applied to large-sized electronic devices (e.g., a television and an external billboard) and small and middle-sized electronic devices (e.g., a portable phone, a personal computer, a notebook computer, a personal digital terminal, a car navigation unit, a game console, a watch-type electronic device, and a camera).

As illustrated in FIG. 1, a display surface, on which an image IM is displayed, is parallel to a first direction DR1 and a second direction DR2. A normal direction of the display surface is parallel to a third direction DR3. The third direction DR3 may indicate a thickness direction of the flexible display apparatus DD. A horizontal direction may mean a direction parallel to a plane perpendicular to the third direction DR3. A front surface and a back surface of each of members may be distinguished by the third direction DR3.

As illustrated in FIG. 1, the display apparatus DD includes a plurality of areas divided from each other on the display surface. In the display apparatus DD, an active area AA (or a display area) and a non-active area NAA (or a non-display area) may be defined depending on whether the image IM is displayed on the area, or whether the area senses a touch. The display apparatus DD displays an image through the active area AA. The non-active area NAA does not display an image. A driving portion and/or interconnection lines for driving the active area AA may be disposed in the non-active area NAA. In FIG. 1, a flower vase image is illustrated as an example of the image IM. The non-active area NAA surrounds the active area AA.

The display apparatus DD may include a folding area FA, a first non-folding area NFA1, and a second non-folding area NFA2. The folding area FA may be folded or bent by an applied external force. The first non-folding area NFA1 and the second non-folding area NFA2 may not be folded or bent by an applied external force. The folding area FA may be disposed between the first and second non-folding areas NFA1 and NFA2. The folding area FA may be folded or bent on a folding axis FX parallel to, for example, the second direction DR2.

Figure 2A:
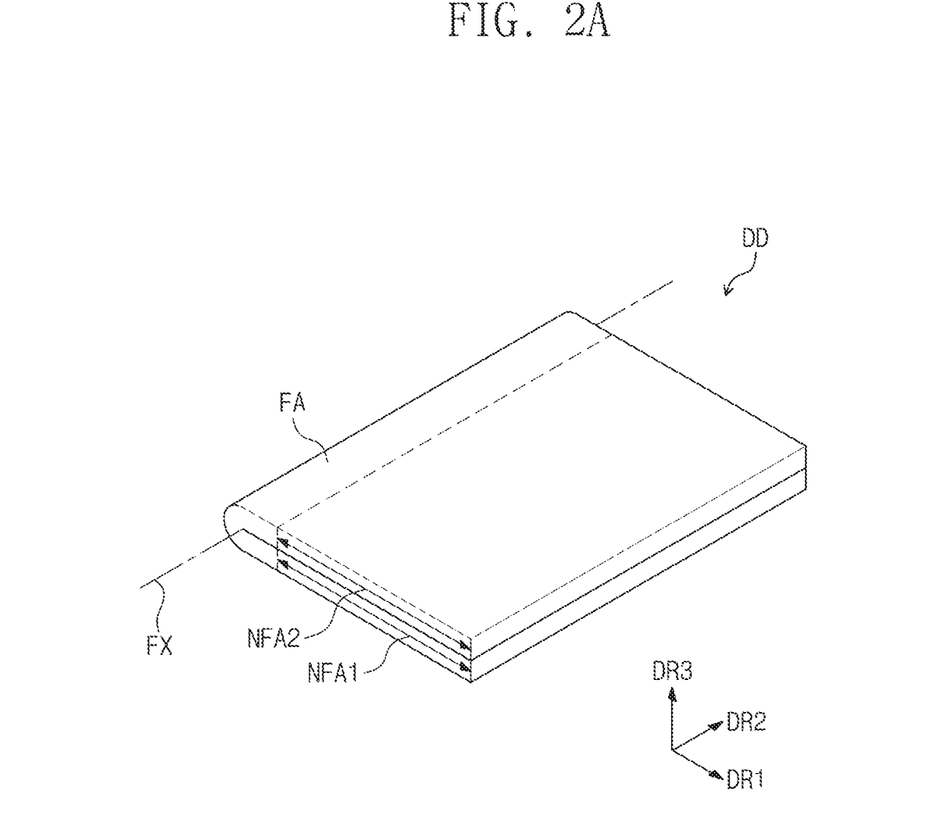
FIG. 2A is a perspective view illustrating a display apparatus according to an exemplary embodiment of the inventive concepts.
Figure 2B:
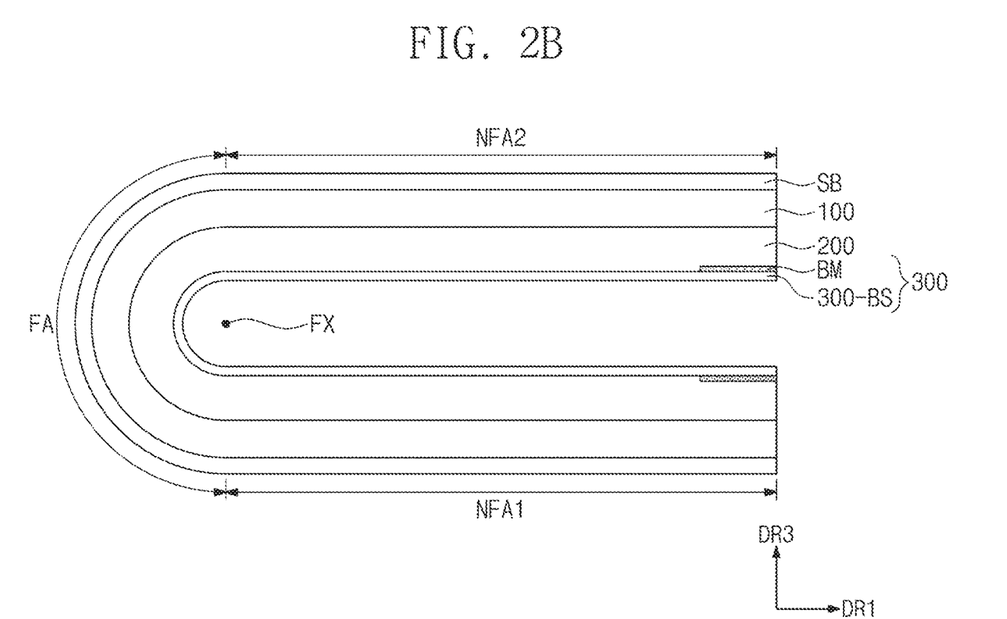
FIG. 2B is a cross-sectional view illustrating a display apparatus according an exemplary embodiment of the inventive concepts.

FIG. 2A is a perspective view illustrating a display apparatus according to an exemplary embodiment of the inventive concepts, and FIG. 2B is a cross-sectional view illustrating a display apparatus according to an exemplary embodiment of the inventive concepts.

As illustrated in FIG. 2A, the display apparatus DD may be folded on the folding axis FX in such a way that a display surface of the first non-folding area NFA1 faces a display surface of the second non-folding area NFA2. Hereinafter, folding the display apparatus in such a way that the display surfaces of the first and second non-folding areas NFA1 and NFA2 face each other is defined as "inner folding". In the present exemplary embodiment, the first non-folding area NFA1 may be rotated on the folding axis in a clockwise direction, and thus, the display apparatus DD may be inner-folded.

Even though not shown in the drawings, the display apparatus DD may be folded on the folding axis FX in such a way that the display surfaces of the first and second non-folding areas NFA1 and NFA2 face outward and are exposed to the outside. Hereinafter, folding the display apparatus in such a way that the display surfaces of the first and second non-folding areas NFA1 and NFA2 face outward and are exposed to the outside is defined as "outer folding".

Referring to FIG. 2B, the display apparatus DD includes a substrate SB, a display portion 100, a touch sensing portion 200, and a window member 300. Even though not shown in the drawings, the display apparatus DD may further include a protection member that adheres to a front surface of the window member 300 and protects the display portion 100 and the touch sensing portion 200. The substrate SB, the display portion 100, the touch sensing portion 200, and the window member 300 may be flexible.

The display portion 100 generates the image IM (see FIG. 1) corresponding to inputted image data. The display portion 100 may be, but not limited to, a liquid crystal display portion, an organic light emitting display portion, an electrophoretic display portion, or an electrowetting display portion. In an exemplary embodiment of the inventive concepts, the organic light emitting display portion will be described as an example of the display portion 100.

The touch sensing portion 200 senses external pressure. For example, the touch sensing portion 200 obtains information of coordinates of an input point. The touch sensing portion 200 may be disposed on a front surface of the display portion 100. The touch sensing portion 200 may be disposed between the window member 300 and the display portion 100. However, a positional relation between the display portion 100 and the touch sensing portion 200 is not limited thereto. The touch sensing portion 200 may be a contact-type or non-contact-type touch sensing portion.

The window member 300 includes a base member 300-BS and a black matrix BM. The black matrix BM may be disposed between the base member 300-BS and the touch sensing portion 200 and may define a bezel area (i.e., the non-active area of FIG. 1) of the display apparatus DD. The black matrix BM may be a colored organic layer and may be formed by, for example, a coating method.

The base member 300-BS may include a glass substrate, a sapphire substrate, and/or a plastic film. Even though not shown in the drawings, the window member 300 may further include a functional coating layer disposed on a front surface of the base member 300-BS. The functional coating layer may include at least one of an anti-fingerprint layer, an anti-reflection layer, or a hard coating layer.

The display portion 100 and the touch sensing portion 200 may be fabricated by continuously performed deposition processes, and thus, the touch sensing portion 200 may be disposed directly on the display portion 100. This will be described later.

Figure 3:
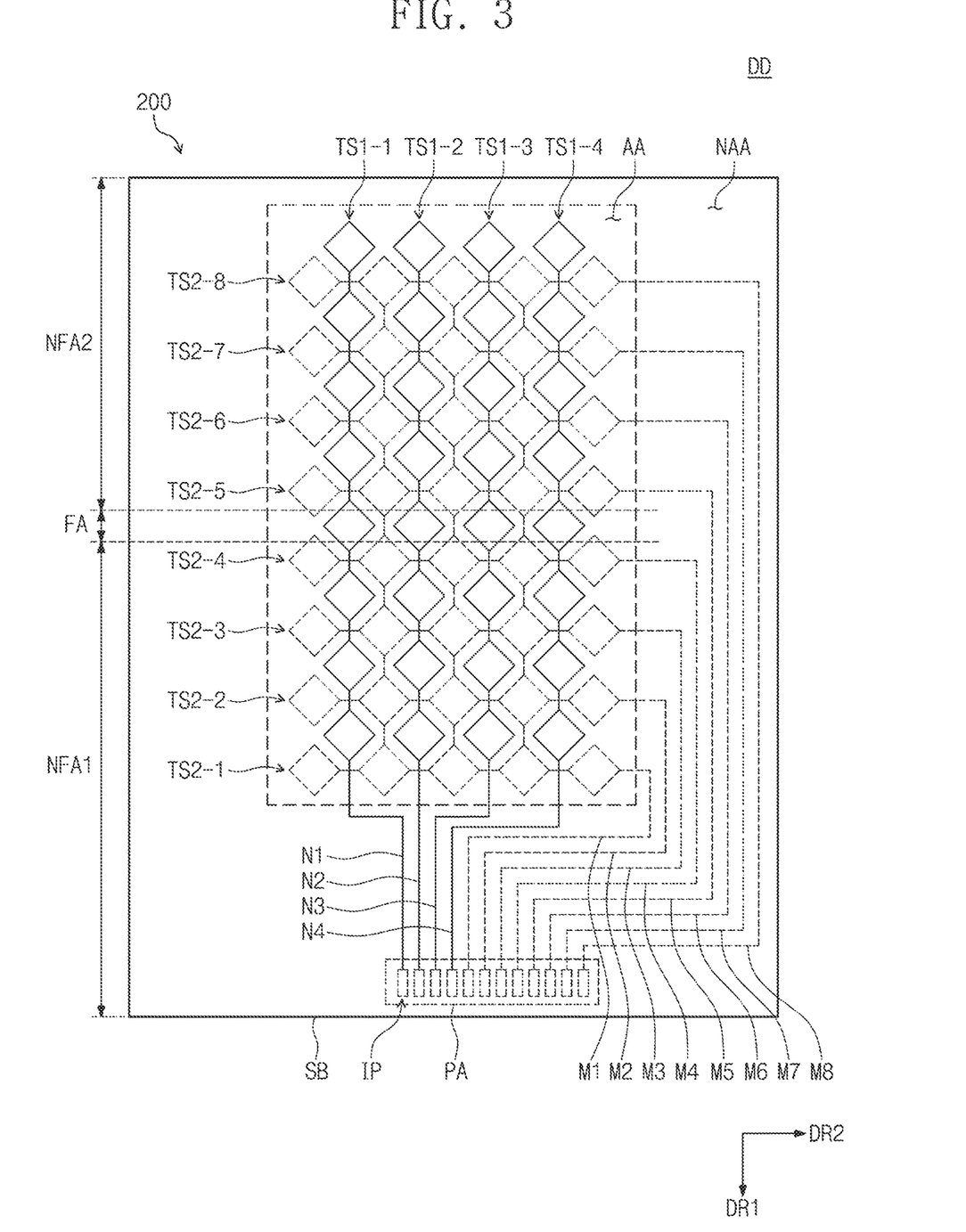
FIG. 3 is a plan view illustrating a display apparatus according to an exemplary embodiment of the inventive concepts.

FIG. 3 is a plan view illustrating a display apparatus according to an exemplary embodiment of the inventive concepts.

Referring to FIG. 3, the touch sensing portion 200 may include first conductive electrodes TS1-1 to TS1-4 and second conductive electrodes TS2-1 to TS2-8. In addition, the display apparatus DD may include a plurality of pad portions IP disposed on a pad area PA of the substrate SB. The pad area PA may be defined at a portion adjacent to one edge of the non-active area NAA. The plurality of pad portions IP may be formed of a metal. For example, the plurality of pad portions IP may include Ag, Mg, Al, Pt, Pd, Au, Ni, Nd, Ir, Cr, Li, Ca, LiF/Ca, LiF/Al, Mo, Ti, any compound thereof, or any mixture thereof. In an exemplary embodiment, the plurality of pad portions IP may include at least one of a transparent metal oxide (e.g., indium thin oxide (ITO), indium zinc oxide (IZO), zinc oxide (ZnO), or indium tin zinc oxide (ITZO)), Mo, or Ti.

The first conductive electrodes TS1-1 to TS1-4 may extend in the first direction DR1 and may be arranged in the second direction DR2. The second conductive electrodes TS2-1 to TS2-8 may extend in the second direction DR2 and may be arranged in the first direction DR1. The second conductive electrodes TS2-1 to TS2-8 may be insulated from and intersect the first conductive electrodes TS1-1 to TS1-4.

FIG. 3 illustrates four first conductive electrodes TS1-1 to TS1-4 and eight second conductive electrodes TS2-1 to TS2-8 as an example. The first conductive electrodes TS1-1 to TS1-4 and the second conductive electrodes TS2-1 to TS2-8 are disposed in the active area AA.

The touch sensing portion 200 may include a plurality of interconnection lines provided in the non-active area NAA. The plurality of interconnection lines may include a plurality of first interconnection lines N1 to N4 and a plurality of second interconnection lines M1 to M8. First ends of the plurality of first interconnection lines N1 to N4 are connected to corresponding ones of the first conductive electrodes TS1-1 to TS1-4, respectively, and second ends of the plurality of first interconnection lines N1 to N4 are connected to corresponding ones of the plurality of pad portions IP, respectively. The plurality of first interconnection lines N1 to N4 may be connected to a touch driving portion (not shown) through the corresponding ones of the plurality of pad portions IP. The plurality of first interconnection lines N1 to N4 may receive signals of driving the first conductive electrodes TS1-1 to TS1-4 from the touch driving portion and/or may receive touch signals, to be provided to the touch driving portion, from the first conductive electrodes TS1-1 to TS1-4.

In addition, first ends of the plurality of second interconnection lines M1 to M8 are connected to corresponding ones of the second conductive electrodes TS2-1 to TS2-8, respectively, and second ends of the plurality of second interconnection lines M1 to M8 are connected to corresponding ones of the plurality of pad portions IP, respectively. The plurality of second interconnection lines M1 to M8 may receive signals of driving the second conductive electrodes TS2-1 to TS2-8 from the touch driving portion and/or may receive touch signals, to be provided to the touch driving portion, from the second conductive electrodes TS2-1 to TS2-8.

Figure 4A:
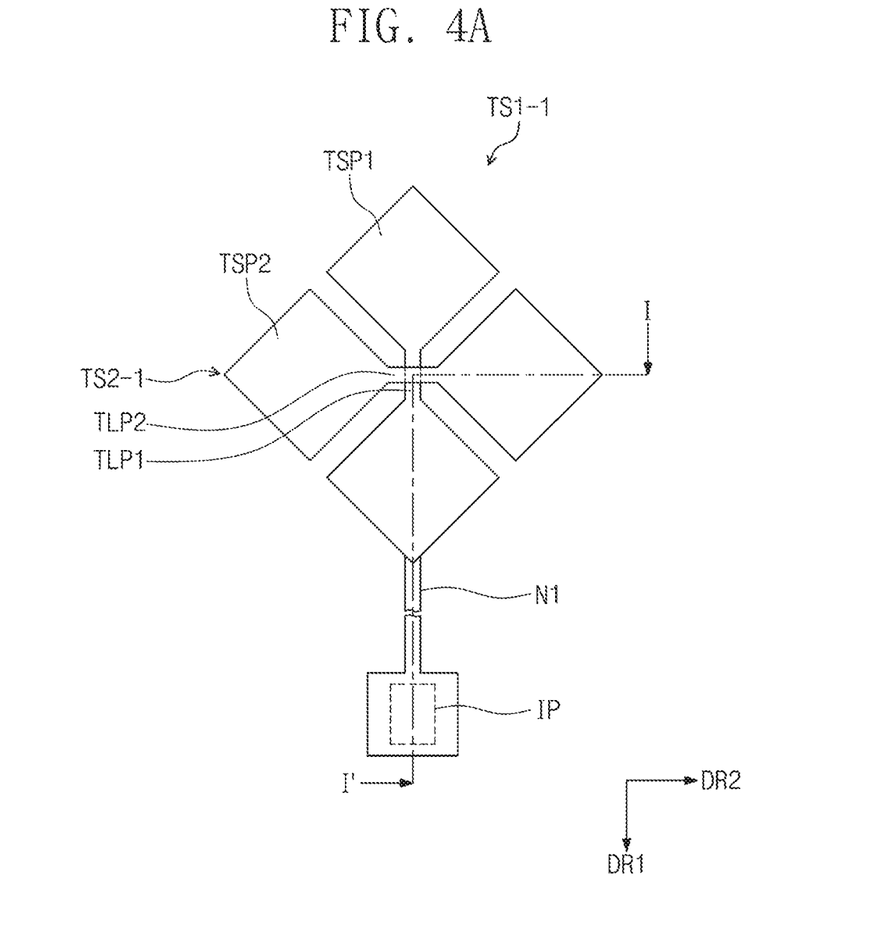
FIG. 4A is an enlarged plan view illustrating first and second sensing electrodes illustrated in FIG. 3.
Figure 4B:
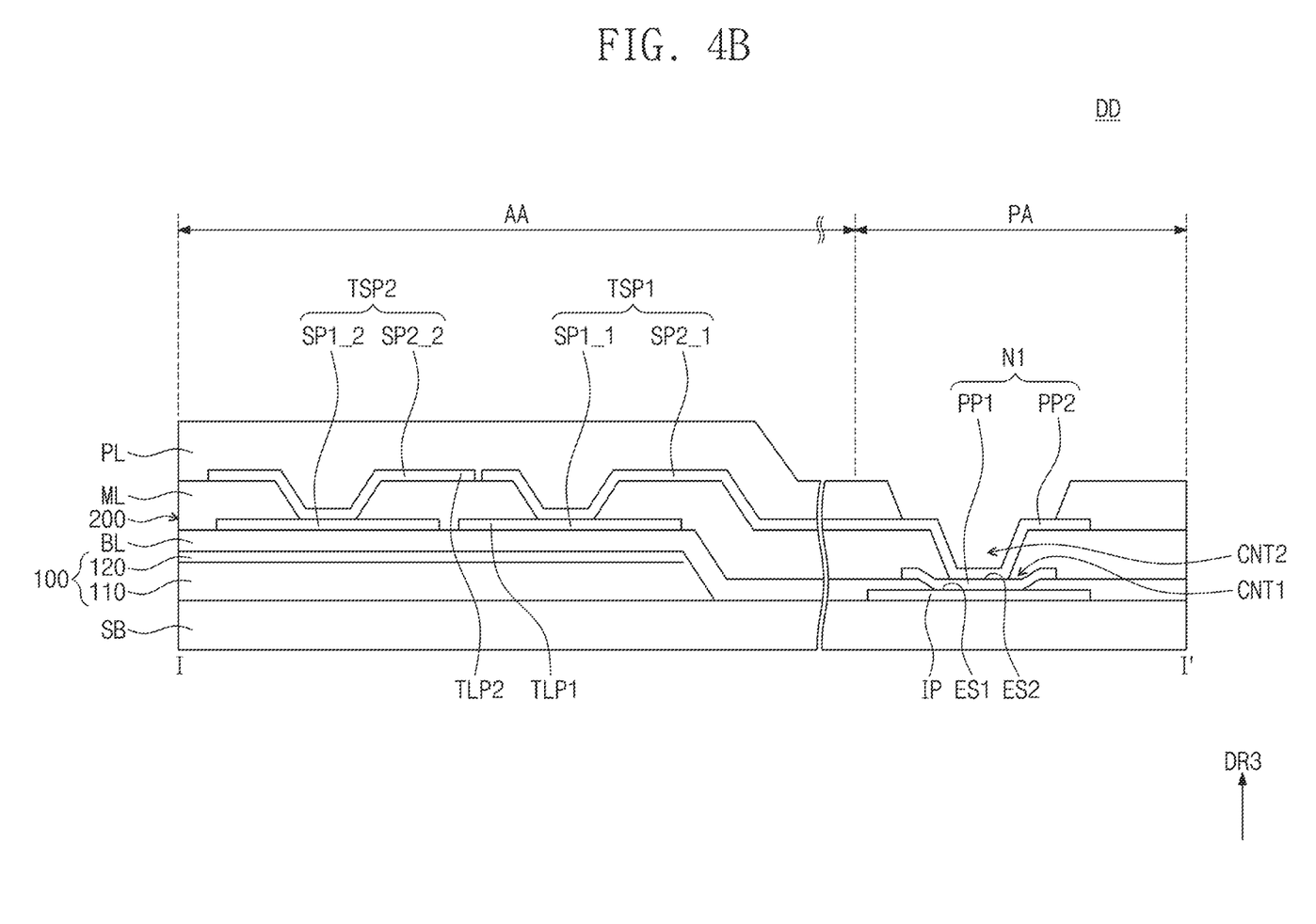
FIG. 4B is a cross-sectional view taken along a line I-I' of FIG. 4A.

FIG. 4A is an enlarged plan view illustrating first and second sensing electrodes illustrated in FIG. 3, and FIG. 4B is a cross-sectional view taken along a line I-I' of FIG. 4A.

FIG. 4A illustrates first sensing electrodes TSP1 of the first conductive electrode TS1-1, second sensing electrodes TSP2 of the second conductive electrode TS2-1, and the first interconnection N1 among the components illustrated in FIG. 3.

The first conductive electrode TS1-1 includes the first sensing electrodes TSP1 arranged in the first direction DR1 and a first connection pattern TLP1 connecting two of the first sensing electrodes TSP1 adjacent to each other in the first direction DR1. The first sensing electrodes TSP1 and the first connection pattern TLP1 may constitute a single body.

The second conductive electrode TS2-1 includes the second sensing electrodes TSP2 arranged in the second direction DR2 and a second connection pattern TLP2 connecting two of the second sensing electrodes TSP2 adjacent to each other in the second direction DR2. The second sensing electrodes TSP2 and the second connection pattern TLP2 may constitute a single body.

The second conductive electrode TS2-1 is insulated from and intersects the first conductive electrode TS1-1.

One end of the first interconnection line N1 may extend from the first sensing electrode TSP1 adjacent to the pad portion IP, and another end of the first interconnection line N1 may overlap with the pad portion IP.

Referring to FIG. 4B, the touch sensing portion 200 may include a first conductive pattern, a middle layer ML, and a second conductive pattern, and the display apparatus DD may further include a buffer layer BL and a passivation layer PL.

In an exemplary embodiment, the display portion 100 may be disposed on the active area AA of the substrate SB but may not be disposed on the pad area PA of the substrate SB.

The pad portion IP may be disposed on the pad area PA of the substrate SB but may not be disposed on the active area AA of the substrate SB.

The display portion 100 may include a pixel layer 110 and a thin film encapsulation layer 120.

The pixel layer 110 may include a plurality of pixels (not shown) arranged in a matrix form. Each of the pixels may include, for example, an organic light emitting device. For example, the organic light emitting device may include an organic light emitting layer disposed between two electrodes.

The thin film encapsulation layer 120 may be disposed on the pixel layer 110. The thin film encapsulation layer 120 may encapsulate the pixel layer 110. The thin film encapsulation layer 120 may protect the pixel layer 110 from the outside to prevent the pixel layer 110 from being damaged by a material such as external air including oxygen or moisture. The thin film encapsulation layer 120 may include an organic layer and/or an inorganic layer. The thin film encapsulation layer 120 may be a single layer or include multiple layers (multi-layer). When the thin film encapsulation layer 120 includes a multi-layer arrangement, the layers of the thin film encapsulation layer 120 may be formed of materials different from each other. For example, the thin film encapsulation layer 120 may include an organic layer and an inorganic layer which are alternately stacked.

The buffer layer BL may be disposed on the active area AA and the pad area PA. The buffer layer BL may cover at least the thin film encapsulation layer 120 and the pad portion IP.

For example, the buffer layer BL may include an organic layer or may be formed of an organic layer. To improve optical characteristics of the display apparatus DD, a refractive index of the buffer layer BL may have a value between a refractive index (or an effective refractive index) of the thin film encapsulation layer 120 and a refractive index of the middle layer ML. In more detail, since the refractive index of the buffer layer BL has the value between the refractive index (or the effective refractive index) of the thin film encapsulation layer 120 and the refractive index of the middle layer ML, it is possible to effectively reduce reflection of external light caused by a difference between the refractive index of the thin film encapsulation layer 120 and refractive indexes of components of the touch sensing portion 200.

A modulus of the buffer layer BL may be smaller than a modulus of the thin film encapsulation layer 120. Thus, flexibility of the display apparatus DD may increase, and occurrence of a fracture may be effectively prevented when the display apparatus DD is bent or folded. Generally, a modulus of an organic layer may be smaller than a modulus of an inorganic layer. In a case in which the thin film encapsulation layer 120 includes an inorganic layer, the buffer layer BL may include an organic layer. Thus, the flexibility of the display apparatus DD may be improved, and efficiency and reliability of a process of fabricating the display apparatus DD may be improved as described later.

For example, the middle layer ML and the passivation layer PL may include an organic layer or may be formed of an organic layer. Thus, the flexibility of the display apparatus DD may be improved, and the efficiency and reliability of the process of fabricating the display apparatus DD may be improved as described later.

The first conductive pattern may be disposed between the buffer layer BL and the middle layer ML. The first conductive pattern may include first sensing patterns SP1_1 and SP1_2 and a first pad pattern PP1. The first sensing patterns SP1_1 and SP1_2 may be disposed on the active area AA, and the first pad pattern PP1 may be disposed on the pad portion IP.

The second conductive pattern may be disposed between the middle layer ML and the passivation layer PL. The second conductive pattern may include second sensing patterns SP2_1 and SP2_2 and a second pad pattern PP2. The second sensing patterns SP2_1 and SP2_2 may be disposed on the active area AA, and the second pad pattern PP2 may be disposed on the pad portion IP.

The first sensing pattern SP1_1 and the second sensing pattern SP2_1 may constitute the first sensing electrode TSP1. The second sensing pattern SP2_1 may be connected to the first sensing pattern SP1_1 exposed through a contact hole defined in the middle layer ML. The first sensing pattern SP1_1 may overlap with the second sensing pattern SP2_1 in the thickness direction DR3.

One end of the first connection pattern TLP1 may extend from the first sensing pattern SP1_1, and another end of the first connection pattern TLP1 may extend from the first sensing pattern SP1_1 of another first sensing electrode TSP1 even though not shown in the drawings.

The first sensing pattern SP1_2 and the second sensing pattern SP2_2 may constitute the second sensing electrode TSP2. The first sensing pattern SP1_2 and the second sensing pattern SP2_2 may not be connected to the first sensing pattern SP1_1 and the second sensing pattern SP2_1 of the first sensing electrode TSP1 but may be insulated from the first sensing pattern SP1_1 and the second sensing pattern SP2_1 of the first sensing electrode TSP1. The second sensing pattern SP2_2 may be connected to the first sensing pattern SP1_2 exposed through a contact hole defined in the middle layer ML. The first sensing pattern SP1_2 may overlap with the second sensing pattern SP2_2 in the thickness direction DR3.

One end of the second connection pattern TLP2 may extend from the second sensing pattern SP2_2, and another end of the second connection pattern TLP2 may extend from the second sensing pattern SP2_2 of another second sensing electrode TSP2 even though not shown in the drawings. The second connection pattern TLP2 may be insulated from the first connection pattern TLP1 and may overlap with the first connection pattern TLP1 in the thickness direction DR3.

Even though not shown in the drawings, the first sensing patterns SP1_1 and SP1_2 and the second sensing patterns SP2_1 and SP2_2 may have a mesh shape.

The first pad pattern PP1 may be connected to the pad portion IP through a first contact hole CNT1. The first contact hole CNT1 may be defined on the pad portion IP and may be defined in the buffer layer BL. The first pad pattern PP1 may be in direct contact with a first exposed surface ES1 of the pad portion IP, which is exposed by the first contact hole CNT1.

The second pad pattern PP2 may be connected to the first pad pattern PP1 through a second contact hole CNT2. The second contact hole CNT2 may be defined on the pad portion IP and the first contact hole CNT1 and may be defined in the middle layer ML. The second pad pattern PP2 may be in direct contact with a second exposed surface ES2 of the first pad pattern PP1, which is exposed by the second contact hole CNT2.

At least a portion of the middle layer ML may overlap with the first contact hole CNT1 in the thickness direction DR3. At least a portion of the middle layer ML may be disposed between the first and second pad patterns PP1 and PP2.

The first pad pattern PP1 and the second pad pattern PP2 may constitute the first interconnection line N1.

One end of the second pad pattern PP2 may extend to the second sensing pattern SP2_1 on the middle layer ML and may be connected to the second sensing pattern SP2_1.

The first and second conductive patterns may be formed of a metal. For example, the first and second conductive patterns may include Ag, Mg, Al, Pt, Pd, Au, Ni, Nd, Ir, Cr, Li, Ca, LiF/Ca, LiF/Al, Mo, Ti, any compound thereof, or any mixture thereof. In certain embodiments, the first and second conductive patterns may include at least one of a transparent metal oxide (e.g., indium thin oxide (ITO), indium zinc oxide (IZO), zinc oxide (ZnO), or indium tin zinc oxide (ITZO)), Mo, or Ti.

As described above, the buffer layer BL, the middle layer ML, and/or the passivation layer PL may be formed of the organic layer, and thus the reflection of external light may be reduced and the flexibility of the display apparatus DD may be improved.

In addition, since the first and second pad patterns PP1 and PP2 are connected to the pad portion IP through the first and second contact holes CNT1 and CNT2, the pad portion IP and the first and second pad patterns PP1 and PP2 may be stably connected to each other and a contact resistance therebetween may be reduced.

Figure 5:
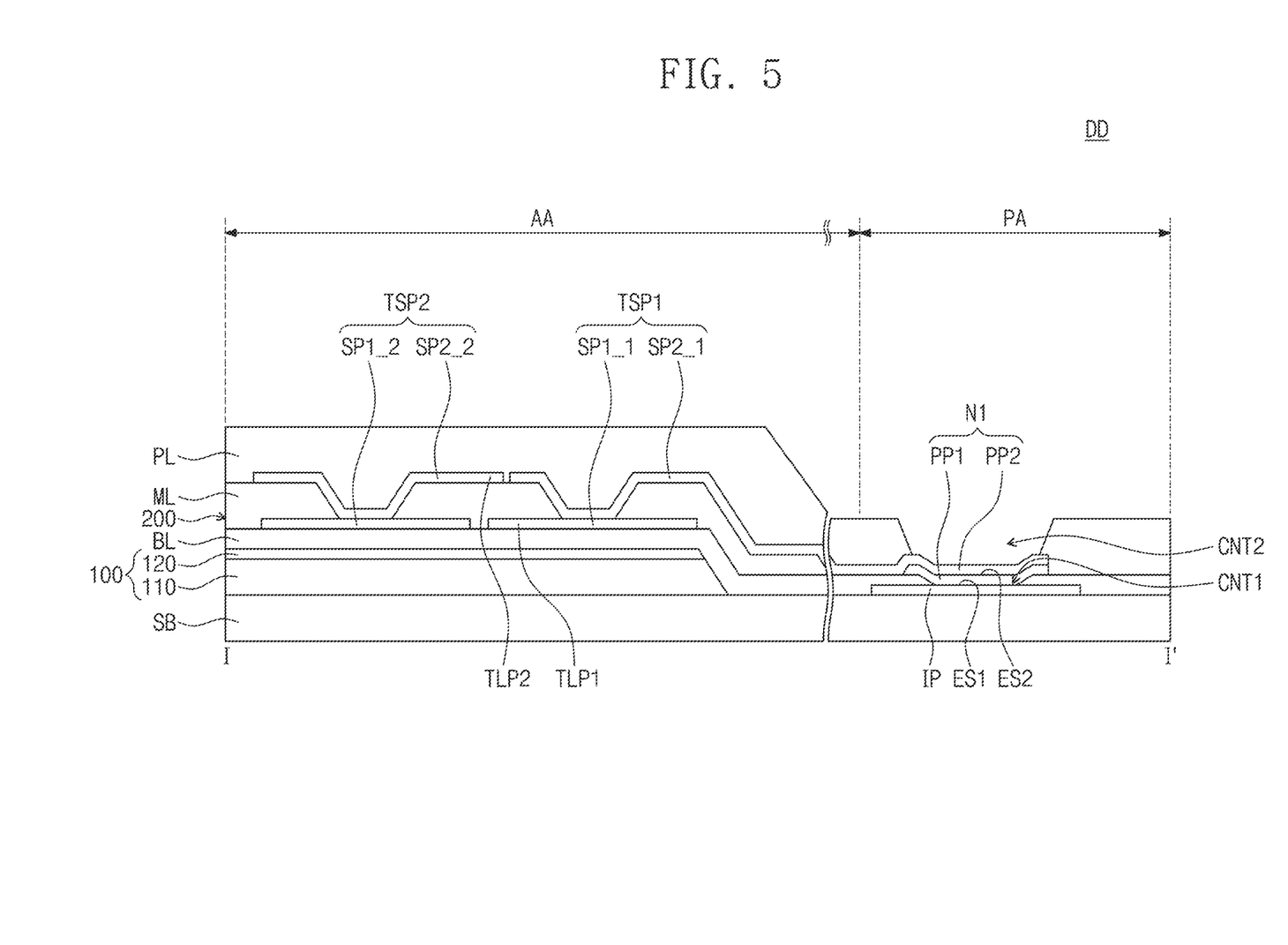
FIG. 5 is a cross-sectional view illustrating a display apparatus according an exemplary embodiment of the inventive concepts.

FIG. 5 is a cross-sectional view illustrating a display apparatus according to an exemplary embodiment of the inventive concepts.

A display apparatus DD of FIG. 5 may be similar to the display apparatus DD of FIG. 4B, and thus, differences related to first and second pad patterns PP1 and PP2 will be mainly described and the descriptions to the same components as in the above exemplary embodiment will be omitted or mentioned only briefly. The same or similar components as in the above exemplary embodiment will be indicated by the same reference numerals or the same reference designators. Referring to FIG. 5, the middle layer ML may not overlap with the first contact hole CNT1 in the thickness direction DR3. The middle layer ML may not be disposed between the first and second pad patterns PP1 and PP2. Thus, the first and second pad patterns PP1 and PP2 may be entirely in contact with each other. As a result, the first and second pad patterns PP1 and PP2 may be stably connected to each other, and a contact resistance therebetween may be reduced.

FIGS. 6A to 6D are cross-sectional views illustrating a method of fabricating a display apparatus, according to an exemplary embodiment of the inventive concepts.

Figure 6A:
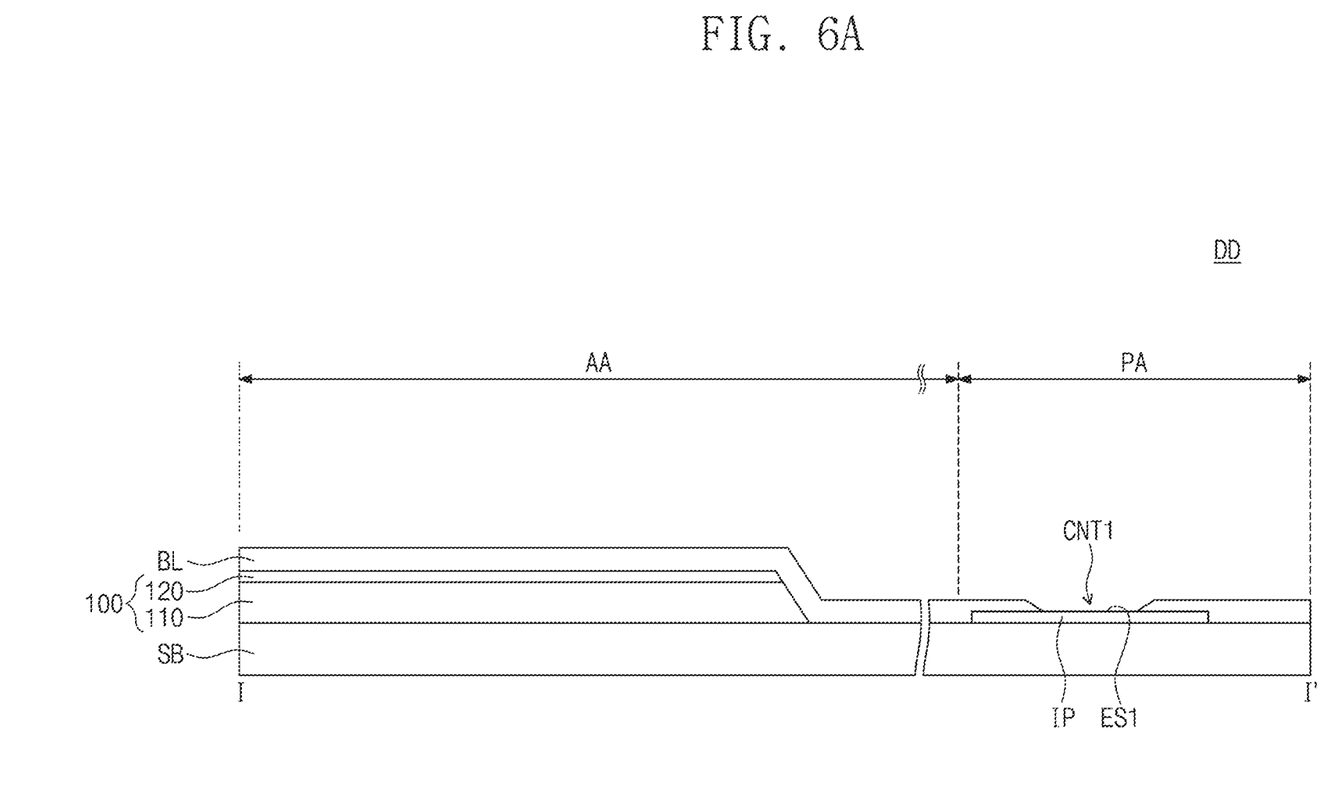
FIG. 6A, FIG. 6B, FIG. 6C, and FIG. 6D are cross-sectional views illustrating a method of fabricating a display apparatus, according to an exemplary embodiment of the inventive concepts.

Referring to FIG. 6A, a pixel layer 110 may be formed on an active area AA of a substrate SB. The pixel layer 110 may include, for example, an organic light emitting layer. For example, the organic light emitting layer may be formed using at least one of various methods such as a vacuum deposition method, a spin coating method, a casting method, a Langmuir-Blodgett (LB) method, an ink-jet printing method, a laser printing method, and a laser induced thermal imaging (LITI) method.

A pad portion IP may be formed on a pad area PA of the substrate SB. The pad portion IP may be formed using a photolithography process.

A thin film encapsulation layer 120 may be formed on the pixel layer 110. For example, the thin film encapsulation layer 120 may be formed of a single layer or a multi-layer by a vacuum deposition method, a sputtering method, or an atomic layer deposition (ALD) method.

A buffer layer BL may be formed on an entire surface of the substrate SB. The buffer layer BL covers the display portion 100 and the pad portion IP. A portion of the buffer layer BL may be deposited directly on the thin film encapsulation layer 120. For example, the buffer layer BL may be formed by depositing an organic material in a vacuum.

Thereafter, a first contact hole CNT1 may be formed by removing a portion of the buffer layer BL covering a first exposed surface ES1 of the pad portion IP. Since the buffer layer BL is formed of the organic layer, the portion of the buffer layer BL may be removed by a wet etching process that may remove only an organic material. Thus, it is possible to inhibit or prevent the pad portion IP from being damaged in the process of patterning the buffer layer BL. On the contrary, if the buffer layer BL includes an inorganic material, the buffer layer BL may be patterned using a dry etching process. In this case, the pad portion IP may be damaged in the patterning process.

A first conductive layer (not shown) may be formed entirely on the substrate SB. The first conductive layer may be formed directly on the buffer layer BL and the first exposed surface ES1.

Figure 6B:
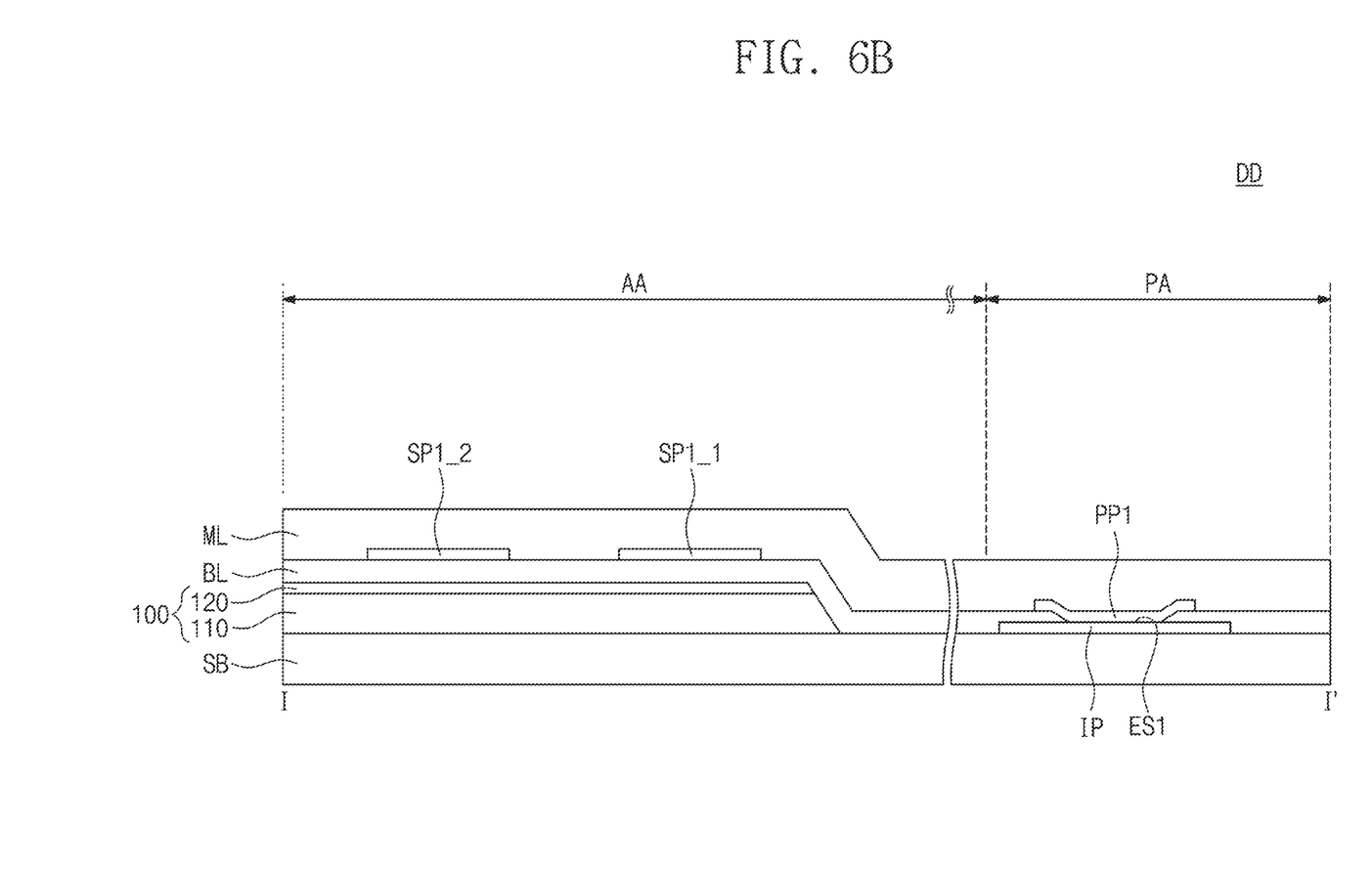

The first conductive layer may cover the buffer layer BL and the first exposed surface ES1. The first conductive layer may be etched along a predetermined pattern by a first etching solution. The first conductive layer may be etched to form first sensing patterns SP1_1 and SP1_2 and a first pad pattern PP1, as illustrated in FIG. 6B. Since the first conductive layer covers an entire portion of the first exposed surface ES1 in the etching process using the first etching solution, it is possible to prevent the first exposed surface ES1 from being etched by the first etching solution. As a result, it is possible to prevent contact failure from occurring between the first pad pattern PP1 and the pad portion IP.

Thereafter, a middle layer ML may be formed entirely on the substrate SB. The middle layer ML may cover the first sensing patterns SP1_1 and SP1_2 and the first pad pattern PP1. For example, the middle layer ML may be formed by depositing an organic material in a vacuum.

Figure 6C:
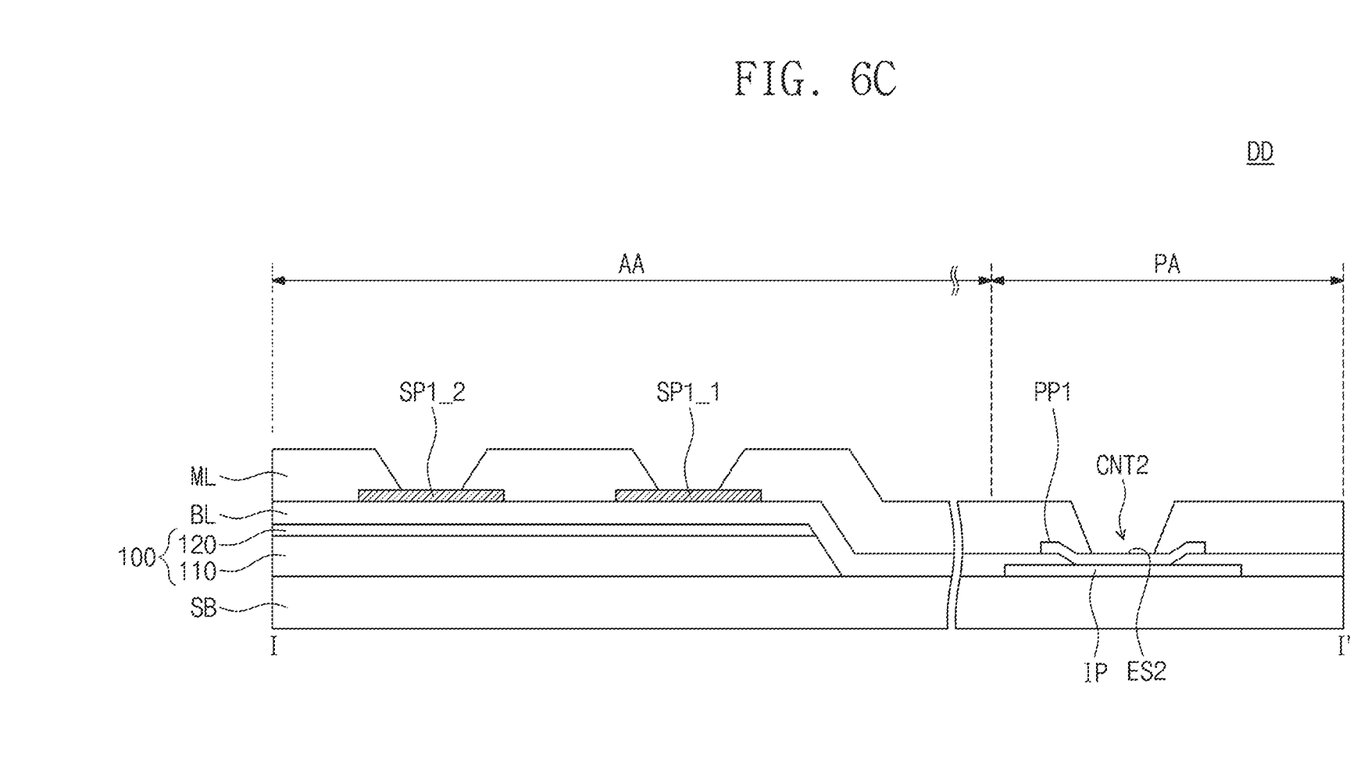

As illustrated in FIG. 6C, a second contact hole CNT2 may be formed by removing a portion of the middle layer ML covering a second exposed surface ES2 of the first pad pattern PP1. In addition, contact holes exposing top surfaces of the first sensing patterns SP1_1 and SP1_2 may be formed by removing portions of the middle layer ML covering the first sensing patterns SP1_1 and SP1_2. Since the middle layer ML is formed of the organic layer, the portions of the middle layer ML may be removed by a wet etching process that may remove only an organic material. Thus, it is possible to inhibit or prevent the first pad pattern PP1 from being damaged in the process of patterning the middle layer ML. On the contrary, if the middle layer ML includes an inorganic material, the middle layer ML may be patterned using a dry etching process. In this case, the first pad pattern PP1 may be damaged in the patterning process.

Figure 6D:
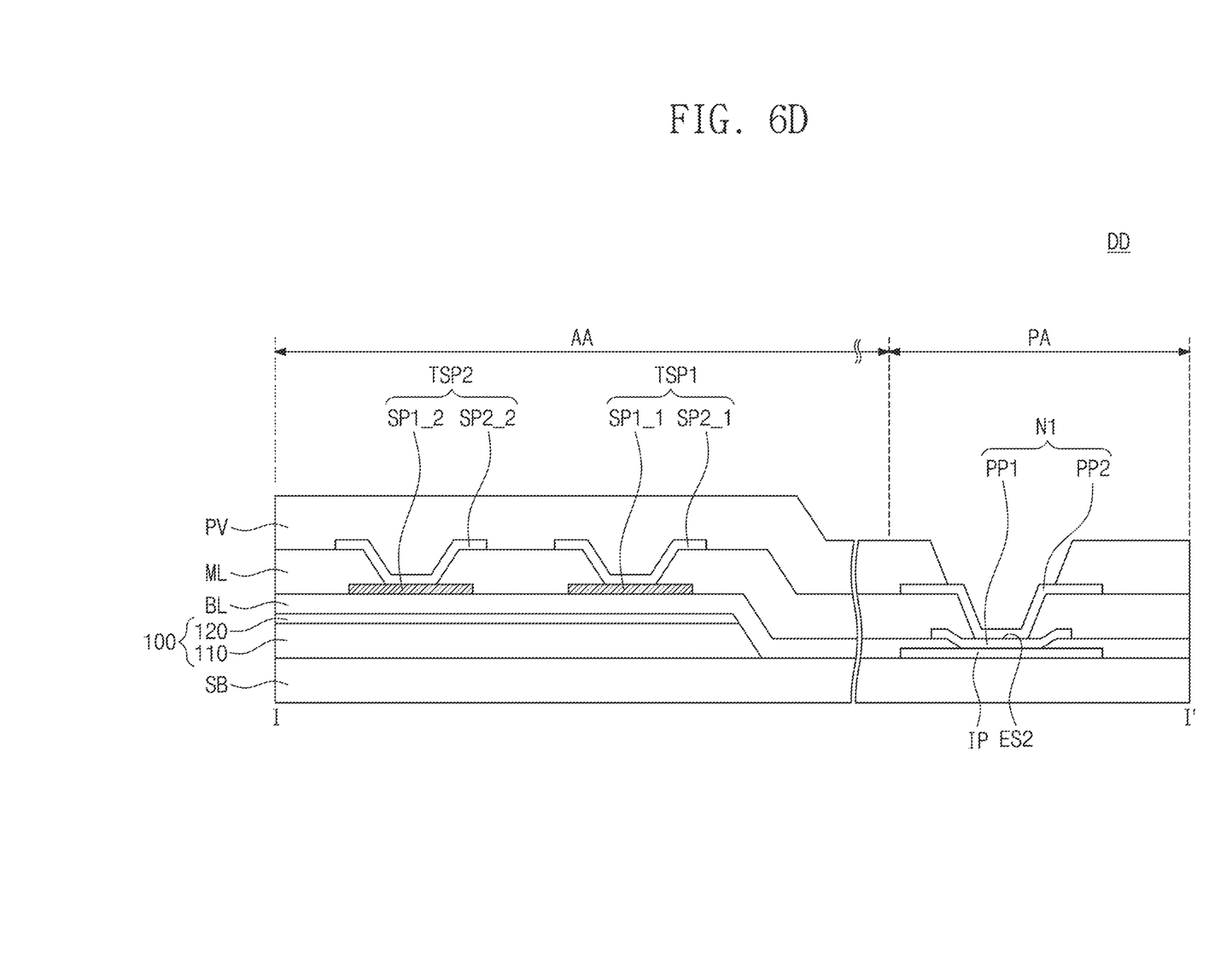

Thereafter, a second conductive layer (not shown) may be formed entirely on the substrate SB. The second conductive layer may cover the middle layer ML and the second exposed surface ES2. The second conductive layer may be etched along a predetermined pattern by a second etching solution. The second conductive layer may be etched to form second sensing patterns SP2_1 and SP2_2 and a second pad pattern PP2, as illustrated in FIG. 6D. Since the second conductive layer covers an entire portion of the second exposed surface ES2 in the etching process using the second etching solution, it is possible to prevent the second exposed surface ES2 from being etched by the second etching solution. As a result, it is possible to prevent contact failure from occurring between the first and second pad patterns PP1 and PP2.

Thereafter, a passivation layer PL may be formed entirely on the substrate SB.

According to the above exemplary embodiments, the buffer layer and/or the middle layer may be formed of the organic layer, and thus, the reflection of external light may be reduced and the flexibility of the display apparatus may be improved.

In addition, since the first and second conductive patterns are connected to the pad portion through the first and second contact holes, the pad portion and the first and second conductive patterns may be stably connected to each other and the contact resistance therebetween may be reduced.

Furthermore, when the display apparatus is fabricated, the first conductive pattern may completely cover the exposed surface of the pad portion to prevent the pad portion from being damaged by the etching solution in the formation of the first conductive pattern.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:
1. A display apparatus comprising:
   a substrate;
   a pixel layer disposed on the substrate;

a thin film encapsulation layer covering the pixel layer and comprising an organic layer and an inorganic layer;

a buffer layer covering the thin film encapsulation layer and comprising an organic material; and a touch sensing portion disposed on the buffer layer.

2. The display apparatus of claim 1, wherein the substrate is flexible and is bent based on a folding axis.

3. The display apparatus of claim 1, wherein the touch sensing portion comprises:

a first conductive pattern disposed on the buffer layer;

a middle layer disposed on the first conductive pattern and comprising an organic material; and a second conductive pattern disposed on the middle layer.

4. The display apparatus of claim 3, wherein a refractive index of the buffer layer has a value between a refractive index of the thin film encapsulation layer and a refractive index of the middle layer.

5. The display apparatus of claim 3, further comprising:

an interconnection line electrically connected to the touch sensing portion; and a pad portion electrically connected to the interconnection line.

6. The display apparatus of claim 5, wherein:

the interconnection line comprises:

a first pad pattern; and a second pad pattern disposed on the first pad pattern; and the second pad pattern is connected to the first pad pattern exposed through a contact hole defined in the middle layer.

7. The display apparatus of claim 1, wherein a modulus of the buffer layer is less than a modulus of the thin film encapsulation layer.

8. The display apparatus of claim 1, further comprising a passivation layer disposed on the touch sensing portion and comprising an organic material.

9. A display apparatus comprising:

a substrate;

a pixel layer disposed on the substrate;

a thin film encapsulation layer covering the pixel layer;

a buffer layer covering the thin film encapsulation layer; and a touch sensing portion disposed on the buffer layer and comprising a first conductive pattern disposed on the buffer layer, a middle layer disposed on the first conductive pattern, and a second conductive pattern disposed on the middle layer, wherein the middle layer comprises an organic material.

10. The display apparatus of claim 9, further comprising a passivation layer disposed on the second conductive pattern and comprising an organic material.

* * * * *